United States Patent [19]

Frank et al.

[11] Patent Number: 4,821,082
[45] Date of Patent: Apr. 11, 1989

[54] HETEROJUNCTION BIPOLAR TRANSISTOR WITH SUBSTANTIALLY ALIGNED ENERGY LEVELS

[75] Inventors: David J. Frank, Tarrytown; Ronald F. Marks, Ossining, both of N.Y.

[73] Assignee: International Business Machines Corporation, Armonk, N.Y.

[21] Appl. No.: 115,778

[22] Filed: Oct. 30, 1987

[51] Int. Cl.⁴ ............................................. H01L 29/72
[52] U.S. Cl. ..................................... 357/34; 357/16; 357/4; 357/61
[58] Field of Search ................. 357/16, 34, 34 HB, 61, 357/4

[56] References Cited

U.S. PATENT DOCUMENTS

| | | | |
|---|---|---|---|
| 4,195,305 | 3/1980 | Moon | 357/16 |
| 4,485,391 | 11/1984 | Poulain et al. | 357/19 |
| 4,529,996 | 7/1985 | Pande | 357/16 |
| 4,538,165 | 8/1985 | Chang et al. | 357/22 |
| 4,573,064 | 2/1986 | McLevige et al. | 357/16 |
| 4,581,621 | 4/1986 | Reed | 357/12 |
| 4,583,105 | 4/1986 | Rosenberg | 357/23.12 |
| 4,586,071 | 4/1986 | Tiwari | 357/16 X |
| 4,593,305 | 6/1986 | Kurata et al. | 357/34 |
| 4,617,724 | 10/1986 | Yokoyama et al. | 357/91 X |
| 4,672,404 | 6/1987 | Ankri et al. | 357/16 |
| 4,727,403 | 2/1988 | Hiba et al. | 357/16 X |
| 4,728,616 | 3/1988 | Ankri et al. | 437/22 |

FOREIGN PATENT DOCUMENTS

| | | | |
|---|---|---|---|
| 0106724 | 4/1984 | European Pat. Off. | 357/34 HB |
| 60-21591 | 10/1985 | Japan | 357/34 HB |
| 61-150373 | 7/1986 | Japan | 357/34 HB |

OTHER PUBLICATIONS

No Author, "Recessed Lateral Double-Heterojunction Bipolar Junction Transistor," *IBM Tech. Discl. Bull.*, vol. 30, No. 6, Nov. 1987.

Jen et al., "Ordered Structures In GaAs$_{0.5}$Sb$_{0.5}$ Alloys Grown By Organometallic Vapor Phase Epitaxy," *Appl. Phys. Lett.*, 48(23), Jun. 9, 86, 1603–05.

Ross, "Theory of Extrinsic And Intrinsic Heterojunctions in Thermal Equilibrium," *Solid-State Electronics*, vol. 23, (1980), pp. 1069–1075.

Su et al., "PhP-Type InP/InGaAsP/InP Bipolar Transistor", *Electronics Letter*, vol. 21, No. 21 (1985).

Jen et al., "Ordered Structures in GaAs$_{0.5}$Sb$_{0.5}$ Alloys Grown by Organometallic Vapor Phase Epitaxy", *Appl. Phys. Lett.* 48(23) (1986).

Primary Examiner—William D. Larkins
Assistant Examiner—William A. Mintel
Attorney, Agent, or Firm—Scully, Scott, Murphy & Presser

[57] ABSTRACT

Heterojunction bipolar transistors are disclosed having an energy band offset in the valence or conduction band and the other of the bands being substantially aligned at the heterojunction. For an npn transistor the conduction band is substantially aligned and the bandgap difference is in the valence band. A pnp type transistor is also disclosed wherein all the bandgap difference is in the conduction band and the valence band is substantially aligned. The npn type transistor provides improved hole confinement in the base as well as enhanced electron injection and collection. In one embodiment of a double heterojunction bipolar transistor, materials are selected that utilize Ga compounds in the base and Al and/or In compounds in the emitter and collector, which have a valence band offset of approximately 400 meV or greater and an aligned conduction band at both of the heterojunctions.

38 Claims, 4 Drawing Sheets

SINGLE HBT

DOUBLE HBT

ENERGY REL TO Au (eV)

ENERGY REL
TO Au (eV)

HETEROJUNCTION BIPOLAR TRANSISTOR WITH SUBSTANTIALLY ALIGNED ENERGY LEVELS

TECHNICAL FIELD

This invention is directed to heterojunction bipolar transistors and, more particularly, to the selection of materials and their affect on the energy bands at the heterojunctions.

BACKGROUND

Heterojunction Bipolar transistors (HBT) are formed by utilizing different semiconductor materials for the emitter or collector and the base. The junction between layers of dissimilar materials being known as the heterojunction and the other junction between common semiconductor materials being a homojunction. In a single heterojunction bipolar transistor having a heterojunction between the emitter and the base, electrons are easily injected from the emitter to the base while hole injection from the base to the emitter is limited by a valence band offset between the emitter and base layers resulting in a current gain higher than a conventional homostructure device. FIG. 1 is an energy band diagram that shows the bandgap, the conduction band and valence band of a single heterojunction bipolar transistor in saturation. While the barrier between the emitter and base greatly reduces the possibility of recombination due to injection of holes back into the emitter region, there is an excess hole charge passing to the collector due to the lack of confinement in the junction between the base and the collector which adversely affects the gain of the transistor. An example of a single heterojunction bipolar transistor may be found in U.S. Pat. No. 4,593,305.

Recently, double heterojunction bipolar transistors (DHBT) have received significant attention. In order to solve the excessive hole charge problem with single HBTs, transistors were fabricated in which both the emitter and collector were formed of materials dissimilar to the base, thus forming a heterojunction at both the emitter/base and collector/base interfaces. FIG. 2 is an energy band diagram of a DHBT in saturation showing the presence of a bandgap in the valence band which includes abrupt barriers at both of the heterojunctions. The DHBT results in good hole confinement in the base region. However, the presence of the additional heterojunction at the base/collector junction also results in an abrupt barrier at this heterojunction in the conduction band which hinders the flow of electrons and hence current flow in the device. An example of the research on double heterojunction bipolar transistors can be found in PnP-type InP/InGaAsP/InP bipolar transistor, Electron Letters., Vol. 21, No. 21, October 10, 1985 by Su, et al. While Su, et al. show that a certain amount of grading at one of the heterojunctions can be obtained, there is still present a barrier to the flow of electrons prohibiting the realization of maximum gain and of minimum emitter-collector saturation voltage.

SUMMARY OF THE INVENTION

The present invention is directed to a heterojunction bipolar transistor having all of the band gap difference occurring in one of the energy bands while the other energy band remains substantially aligned. The collector, base and emitter regions are formed such that at least one of the junctions between the regions is between different semiconductor materials resulting in a transistor having at least one heterojunction. The semiconductor materials of each of the collector, base and emitter regions are selected so that the energy level of either the conduction band or the valence band is aligned at the heterojunction and the bandgap of the base does not exceed that of the emitter or collector. In an npn single heterojunction transistor, the heterojunction is formed between the emitter and base and the conduction band is the aligned band, with the bandgap difference being only in the valence band. In an npn double heterojunction transistor, the collector layer and the base layer form a first heterojunction and the emitter layer and the base layer form a second heterojunction. The semiconductor materials for the collector, base and emitter are selected so that all of the energy band offset occurs in the valence band and the conduction band is substantially aligned at the first and second heterojunctions.

The aligned conduction band heterojunction bipolar transistor of the present invention provides at least the following advantages:

1. Reduced recombination, due to the absence of potential wells in the conduction band, which often occur in ordinary HBTs because of band offsets.
2. Improved emitter collector saturation voltage characteristics, again due to the absence of band offsets. In fact, the saturation voltage would probably be lower than for homojunction bipolar transistors because the holes do not start to leak out of the base.
3. Excellent confinement of the holes to the base, since both of the heterojunctions are abrupt, rather than graded and since the valence band offset can be larger than that which is usually available in GaAs/AlGaAs structures. This results in higher emitter efficiency, higher beta, lower device capacitances and higher speed.
4. Symmetric structure of the double heterostructure allows interchange of emitter and collector, and results in holes being confined to the base on both sides.
5. Higher speed in circuits involving saturation.

In addition, for suitable material pairs, lower power operation may be achieved.

The inventors have determined from calculations based on Schottky barrier heights and bandgap data, that material pairs can be selected for the emitter/collector and the base that have a conduction band offset between the two materials approaching zero. However, the invention is not limited to the specific examples described herein since the selection of material pairs was based on practical considerations, such as, known techniques for growing the transistors. As advances in the techniques for growing transistors are made, other material pairs may be realized that come within the scope of the present invention. In one embodiment of an npn HBT using III-V compounds, gallium compounds are utilized in the base and aluminum and/or indium compounds are utilized in the emitter and collector. In addition to gallium, indium and aluminum, the III-V semiconductor compounds include at least one of phosphorous, arsenic or antimony. In a further preferred embodiment, the base and emitter/collector materials are lattice matched in order to facilitate growth of the semiconductor materials. In addition, the selection of materials can be made based on particular applications and the required transistor characteristics. For example, the materials can be selected to provide a valence band offset of approximately 0.4 eV or greater and a substantially aligned conduction band.

The heterojunction bipolar transistor having an aligned conduction band and all of the bandgap in the valence band, as stated above, is described for an npn transistor. It should be understood that the invention can be realized in a complementary manner for pnp heterojunction bipolar transistors in which the valence band would be aligned and all of the bandgap difference would be present in the conduction band. A pnp transistor in accordance with the invention would have enhanced confinement of electrons in the base and improved transport of holes. This would result in a transistor having a similar improvement in gain to that of the aligned conduction band npn transistor. In addition, the other advantages noted above for the npn transistor would also apply to the pnp transistor with the exception that they would be realized in a complementary manner to that described above.

DETAILED DESCRIPTION OF THE PREFERRED EMBODIMENT OF THE INVENTION

Figure 3:
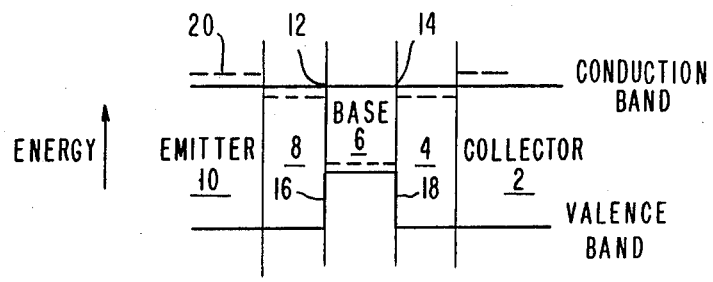
FIG. 3 is an energy band diagram of the double heterojunction bipolar transistor of the present invention without charge or doping.

In the preferred embodiment of the present invention, bipolar transistors are formed by utilizing semiconductor material pairs in the III-V group that, when formed into a heterojunction bipolar transistor, uniquely provide band line-ups wherein one of the energy bands is substantially aligned at the heterojunction and in which all of the bandgap difference is in the other energy band. FIG. 3 shows the band line-ups for an npn double heterojunction bipolar transistor without any charge. In the DHBT, the semiconductor materials forming the emitter and collector are the same, with the base being formed from different semiconductor materials. The junction between the emitter and base and the junction between the base and collector are between dissimilar materials and therefore both junctions are heterojunctions. As shown in FIG. 3, the conduction band is substantially aligned at heterojunctions 12 and 14 and all of the bandgap difference is in the valence band. Although not shown, a single heterojunction bipolar transistor (SHBT) has only one of the region interfaces, preferably between the emitter and the base, being between different materials. An npn SHBT would also have an aligned conduction band and the bandgap difference in the valence band. The major difference with a DHBT would be in the valence band, where there would be an offset only at the emitter-base junction of the SHBT.

Referring again to FIG. 3, the conduction band, at the emitter-base heterojunction 12 and at the collector-base heterojunction 14, is substantially aligned. The DBHT of the present invention having an aligned conduction band eliminates the electron flow problems with prior art DBHTs. The aligned conduction band bipolar heterojunction transistor has enhanced electron injection and collection resulting in improved current flow in the device. In addition, all of the bandgap difference in the aligned conduction band DBHT is present in the valence band offsets 16 and 18. The holes are therefore well confined in the base resulting in higher emitter efficiency, higher beta, lower device capacitances and higher speeds.

In an illustrative embodiment of the DHBT of FIG. 3, the collector layer is formed with an n+ doped region 2 and an n doped region 4 grown on region 2. The base is formed by a single layer p+ doped region 6 grown on region 4. The emitter layer is formed of an n doped region 8 grown onto region 6 and an n+ doped region 10 grown onto region 8. The dashed lines 20 show the quasi-fermi levels corresponding to the doping in each region of the device. In the illustrative embodiment of the invention, approximate doping concentrations may be as follows: regions 2 and 10 are $5 \times 10^{18}$; regions 4 and 8 are $10^{17}$ and region 6 is $10^{19}$ cm$^{-3}$. The layer width for each region may be approximately 100 nm. The doping concentrations and layer size are provided merely as examples and in no way is the invention limited to these parameters.

Figure 4:
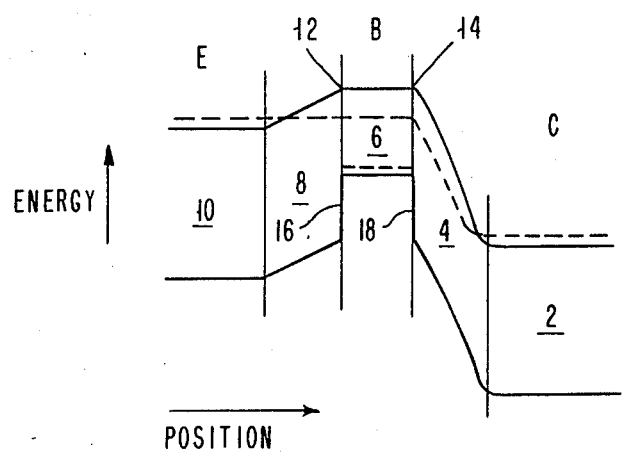
FIG. 4 is an energy band diagram of the DHBT of the present invention in operation with the collector biased positive.
Figure 5:
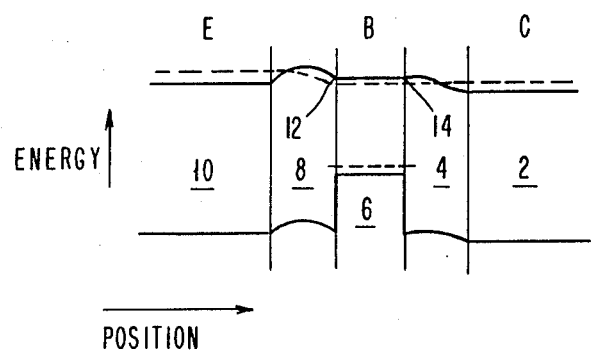
FIG. 5 is an energy band diagram of the DHBT of the present invention in saturation.

The band line-ups of the aligned conduction band DBHT of the present invention when the collector is biased positive is shown in FIG. 4. While there is a small bandgap difference in the conduction band with the transistor in the biased state, the heterojunctions 12 and 14 are still considered to be substantially aligned as there is no abrupt shift in the energy, but instead, a smooth transition. This can be contrasted with the abrupt energy shifts at heterojunctions 16 and 18 in the valence band. The flow of electrons from the emitter to the collector would be essentially uninhibited due to the absence of any abrupt barriers in the conduction band. FIG. 5 shows the band line-ups for the aligned conduction band DBHT of the present invention with the transistor in saturation. The conduction band is substantially aligned at heterojunctions 12 and 14 which provides improved emitter/collector saturation voltage characteristics due to the absence of conduction band offsets. Furthermore, the base does not have any potential wells which might confine electrons or increase recombination. The only barriers to the flow of electrons from the emitter to the collector are due to space-charge effects which can be seen as slight bumps in the conduction band in regions 4 and 8. The space charge effects are also present in non-aligned HBTs but are obscured due to the larger effects caused by offsets in both bands.

Figure 6:
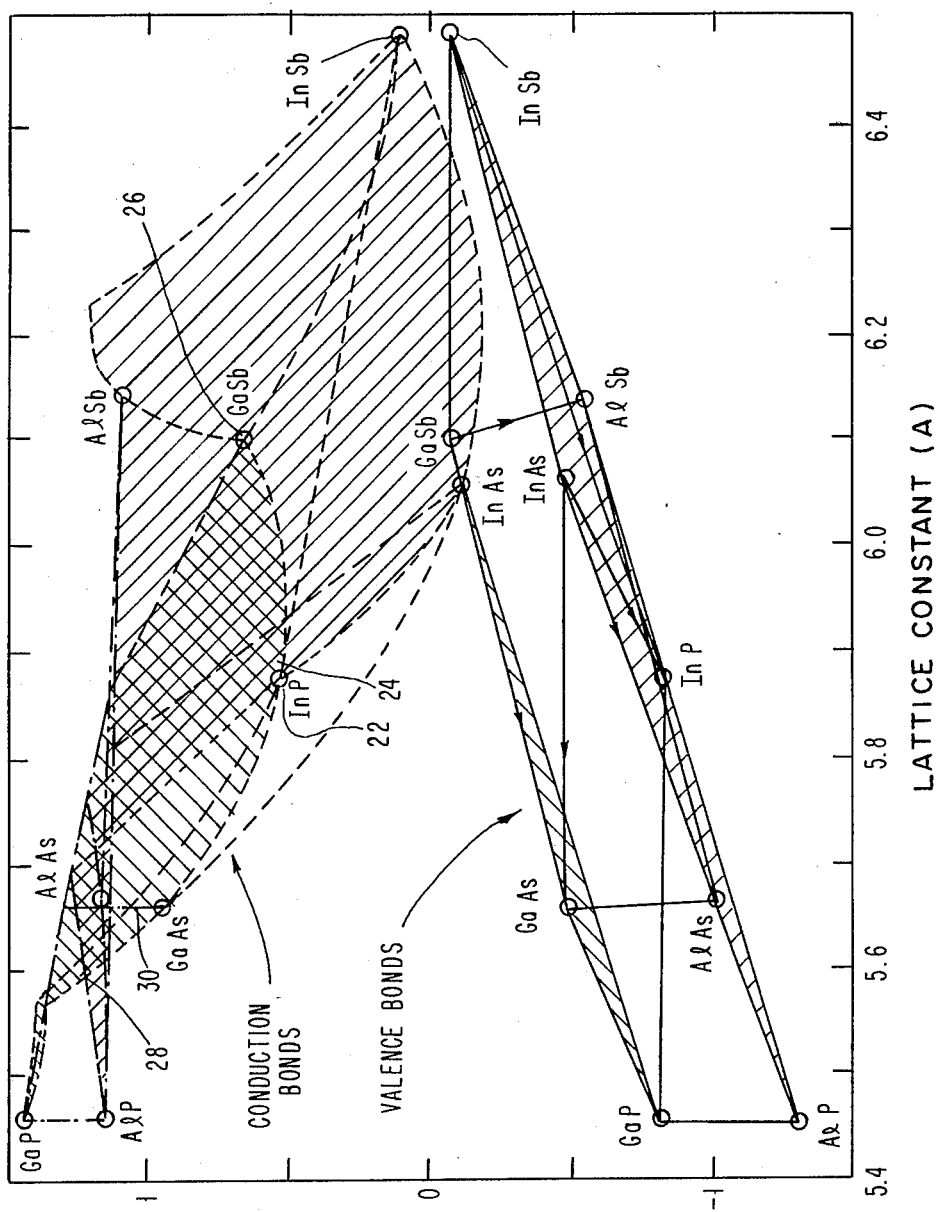
FIG. 6 is a graph of the energy band line-ups for materials in the III-V groups showing materials that may be utilized in the present invention.

In a preferred embodiment, the aligned band DHBT of the present invention is fabricated utilizing III-V compounds. FIG. 6 is a graph derived from the existing data on the bandgaps for III-V compounds and electrical measurements of heterojunction band offsets of III-V compounds. The graph provides the criteria for the selection of material pairs which embody this invention. The graph of FIG. 6 is a representation of the energy relative to Au in electron volts versus the lattice constant in Angstroms. The lattice constant is the fundamental period of a single crystal of unstrained semiconductor material. The energy relative to Au is based on the Schottky barrier heights of the III–V compounds and represents the current knowledge of band offsets for these materials. The upper section of the graph represents the conduction bands and the lower section of the graph represents the valence bands. The conduction bands are shown in dotted lines while the valence bands are shown in solid lines.

The selection of materials from group III are preferably the alloys Al, Ga and In, while the group V alloys are selected from the group of P, As and Sb. The graph of FIG. 6 is based on a selection of gallium compounds for the base and aluminum and/or indium compounds for the emitter and collector. Thus, the base materials are selected from the group Ga(P,As,Sb) and the emitter and collector materials are selected from the group (Al,In)(P,As,Sb). The Ga compounds are depicted in the valence and conduction bands with hatching going upward from left to right and the Al and In compounds are depicted in the valence and conduction bands with hatching going downward from left to right. The cross-hatched area in the conduction band denotes possible combinations of materials in which the base and emitter/collector compounds have equal conduction band energy levels. Thus, for each point in the cross-hatched region at least one suitable compound pair exists for which a transistor can be made exhibiting a substantially aligned conduction band.

The cross-hatched area of FIG. 6 is directed to a preferred embodiment of the invention in which the selection of materials incorporates compounds having a valence band offset of approximately 0.4 eV or greater. It should be understood that other material pairs having smaller offsets might also be useful and the present invention is not limited to materials having a particular valence band offset.

Four examples of material pairs which incorporate the preferred embodiment can be found at points 22, 24, 26 and 28 in FIG. 6 and are set forth in the Table below:

TABLE

| Graph Point | Emitter/Collector Materials | Base Materials |
|---|---|---|
| 22 | InP | $GaAs_{.53}Sb_{.47}$ |
| 24 | $In_{.69}Al_{.31}As$ | $GaAs_{.38}Sb_{.62}$ |
| 26 | $In_{.55}Al_{.45}As_{.55}Sb_{.45}$ | GaSb |
| 28 | $In_{.33}Al_{.67}P$ | $GaAs_{.69}P_{.31}$ |

Taking the first table entry as a detailed example, the room temperature bandgap of InP is 1.35 eV, while the bandgap of GaAsSb is 0.77 eV. Hence, the valence band offset is 0.58 eV. As can be seen in FIG. 6, this offset is close to the largest possible valence band offset and indicates that the holes would be extremely well confined. Another advantage of utilizing InP for the emitter and collector is the higher electron mobilities that are achievable as compared to that obtained with AlGaAs, thus improving the transistor characteristics. In addition, since the bandgap of the base is only 0.77 eV, the DHBT of the present invention would have a lower emitter-base turn-on voltage and hence, lower power.

The III–V compounds in the above Table all result in an aligned conduction band DBHT. In addition, it is preferred that the base and emitter/collector material pairs be lattice matched in order to facilitate fabrication of the transistor. However, the aligned conduction band DBHT may be fabricated with material layers that are strained.

Figure 1:
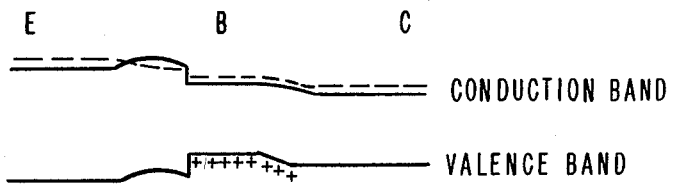
FIGS. 1 and 2 are energy band diagrams of prior art single and double heterojunction bipolar transistors, respectively.
Figure 2:
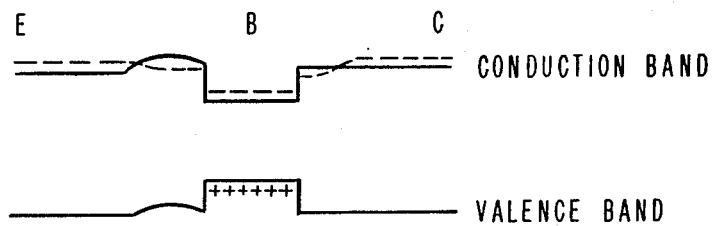
Figure 8:
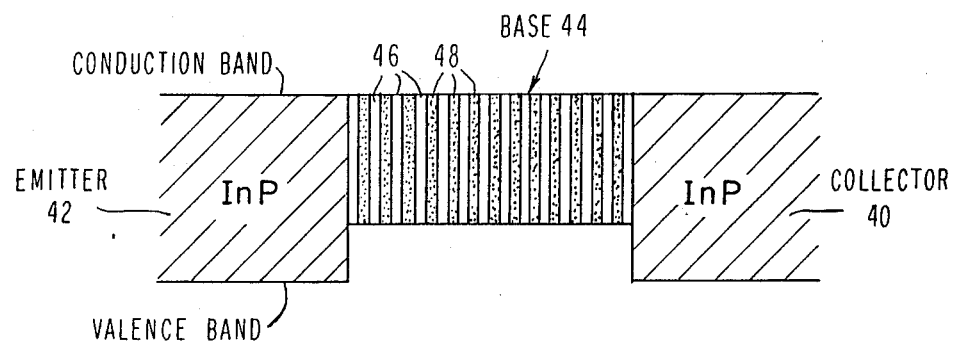
FIG. 8 is an energy band and structure diagram of a transistor having a superlattice base region.

Ternary and quaternary compound semiconductors could be either random alloys, or very closely spaced binary superlattices with a minimum period of one monolayer. FIG. 8 is a combination energy bandgap and structure diagram showing the energy band levels for an undoped structure with a superlattice in the base region. The structure of FIG. 8 shows a collector layer 40 and an emitter layer 42 of InP and a base layer 44 formed of alternate layers 46 and 48 of GaAs and GaSb, respectively. The material compositions shown are for illustration only and correspond to those of the first entry in the table. It is important to note that the energy levels shown for the superlattice are of the composite material, not those of the individual constituents; GaAs and GaSb in the example. This is the result of the close spacing of the superlattice which is preferred. In addition, the material combination described herein may be implemented with a superlattice in the emitter and collector rather than, or in addition to, in the base. The superlattice approach would be easier to grow in a molecular beam epitaxy (MBE) system. However, any of the known processing techniques to make transistors such as, metal organic chemical vapor deposition (MOCVD) and MBE, can be utilized to grow the layers with the necessary dopings.

The practical considerations for the selection of materials include lattice matching the transistor layers to the substrate. A material pair lattice matched to a GaAs substrate is $In_{0.48}Ga_{0.52}P$ for the emitter and collector and $Ga_{0.87}Al_{0.13}As$ for the base, which provides an approximately 0.27 eV band offset and a substantially aligned conduction band. This material pair is shown as point 30 in FIG. 6 and is an example of an embodiment wherein the band offset is less than 0.4 eV. As noted above, the invention is not limited to lattice matched material pairs or lattice matching to the substrate as it is contemplated that materials may be found that have substantially aligned conduction bands having strained layers which would not depart from the spirit of the invention.

Figure 7:
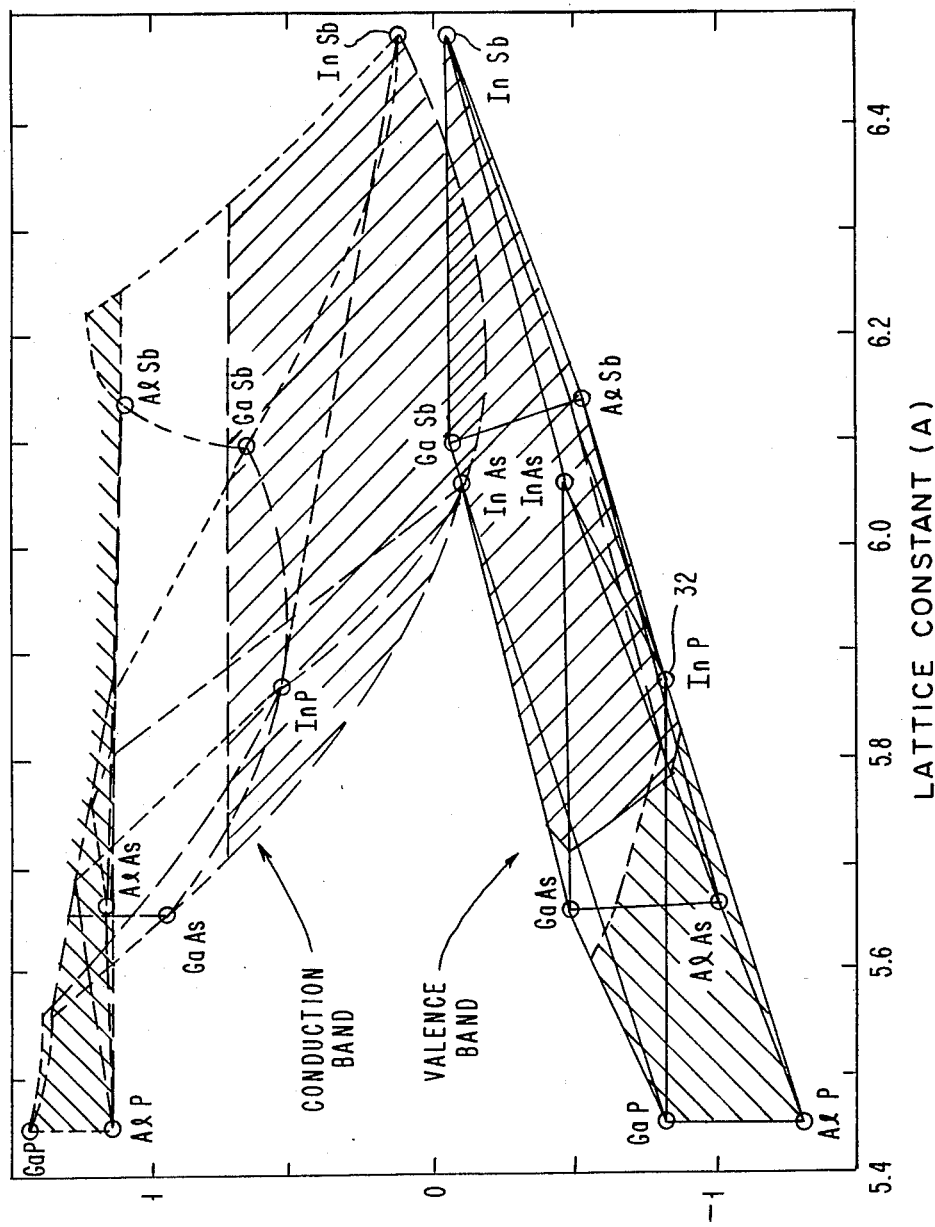
FIG. 7 is a graph similar to FIG. 6 for pnp transistor materials.

The majority of the above description of the invention is directed towards an npn transistor. However, as noted above, an analogous pnp HBT is also contemplated. The pnp device has a substantially aligned valence band and all the bandgap difference in the conduction band. FIG. 7 is a graph similar to FIG. 6 but having the materials selected for a pnp transistor. The conduction band region of the graph has been partitioned into two regions such that at least a 0.4 eV offset exists between them. The upper region represents emitter/collector materials, and the lower region represents base materials. Other positions for the 400 mV gap are also possible. Given the conduction band partition the materials corresponding to an aligned valence band were located. The cross-hatched area depicts the material pairs that would provide an aligned valence band with the selected conduction band offset. An example of a pnp aligned valence band DHBT is shown at point 32 in FIG. 7 and utilizes InP for the base and AlAsSb for the emitter and collector. The conduction band offset would be approximately 0.6 eV.

While the invention has been particularly shown and described with respect to preferred embodiments thereof, it will be understood by those skilled in the art that the foregoing and other changes in form and details may be made therein without departing from the spirit and scope of the invention.

Having thus described our invention, what we claim as new, and desire to be secured by Letters Patent is:

1. A heterojunction bipolar transistor comprising:
a collector layer of a first conductivity type;
a base layer of a second conductivity type forming a first junction with said collector layer; and
an emitter layer of the first conductivity type forming a second junction with said base layer;
at least one of the first and second junctions being between different semiconductor materials thereby forming at least one heterojunction, the semiconductor materials of each of said collector, base and emitter layers having conduction and valence band energy levels wherein the energy levels of one of said bands are substantially aligned at said at least one heterojunction and an abrupt energy level offset occurs in the other of said bands at said at least one heterojunction.

2. The heterojunction bipolar transistor of claim 1 wherein the collector layer and the emitter layer are both n-type and the base layer is p-type and wherein said abrupt energy level offset occurs in the valence band and wherein the conduction band energy levels are substantially aligned at said at least one heterojunction.

3. The heterojunction bipolar transistor of claim 1 wherein the collector layer and the emitter layer are both p-type and the base layer is n-type and wherein said abrupt energy level offset occurs in the conduction band and wherein the valence band energy levels are substantially aligned at said at least one heterojunction.

4. The heterojunction bipolar transistor of claim 2 or 3 wherein both the first and second junctions are between different semiconductor materials thereby forming first and second heterojunctions wherein the energy levels are aligned at both the first and second heterojunctions.

5. A heterojunction bipolar transistor comprising:
a collector layer of a first conductivity type;
a base layer of a second conductivity type forming a first heterojunction with said collector layer; and
an emitter layer of the first conductivity type forming a second heterojunction with said base layer;
the semiconductor materials of each of said collector, base and emitter layers having conduction and valence band energy levels wherein each of the energy levels of one of said bands are substantially aligned at the first and second heterojunctions and an abrupt energy level offset occurs in the other of said bands at the first and second heterojunctions.

6. The heterojunction bipolar transistor of claim 5 wherein the collector layer and the emitter layer are both n-type and the base layer is p-type and wherein said abrupt energy level offset occurs in the valence band and wherein the conduction band energy levels are substantially aligned at the first and second heterojunctions.

7. The heterojunction bipolar transistor of claim 6 wherein the semiconductor material forming the emitter and collector layers s a compound containing at least one element selected from the group consisting of Al and In.

8. The heterojunction bipolar transistor of claim 6 wherein the semiconductor material forming the base layer is a compound containing Ga.

9. The heterojunction bipolar transistor of claim 7 wherein the semiconductor material forming the emitter and collector layers is a compound including at least one element selected from the group consisting of P, As and Sb.

10. The heterojunction bipolar transistor of claim 8 wherein the semiconductor material forming the base layer is a compound including at least one element selected from the group consisting of P, As and Sb.

11. The heterojunction bipolar transistor of claim 6 wherein the valence band offset is approximately 0.4 eV or greater.

12. The heterojunction bipolar transistor of claim 11 wherein the emitter and collector contain InP and the base contains GaAsSb.

13. The heterojunction bipolar transistor of claim 12 wherein the emitter and collector contain InP and the base contains $GaAs_{0.53}Sb_{0.47}$.

14. The heterojunction bipolar transistor of claim 11 wherein the emitter and collector contain InAlAs and the base contain GaAsSb.

15. The heterojunction bipolar transistor of claim 14 wherein the emitter and collector contain $In_{0.69}Al_{0.31}As$ and the base contain $GaAs_{0.38}Sb_{0.62}$.

16. The heterojunction bipolar transistor of claim 11 wherein the emitter and collector contain InAlAsSb and the base contain GaSb.

17. The heterojunction bipolar transistor of claim 16 wherein the emitter and collector contain $In_{0.55}Al_{0.45}As_{0.55}Sb_{0.45}$.

18. The heterojunction bipolar transistor of claim 11 wherein the emitter and collector contain InAlP, and the base contain GaAsP.

19. The heterojunction bipolar transistor of claim 18 wherein the emitter and collector contain $In_{0.33}Al_{0.67}P$, and the base contain $GaAs_{0.69}P_{0.31}$.

20. The heterojunction bipolar transistor of claim 11 wherein the collector layer is a multi-region layer containing a first region of $n^+$-type doping and a second region of n-type doping and the base layer is a single region of $p^+$-type doping.

21. The heterojunction bipolar transistor of claim 20 wherein the $n^+$-type regions have a doping concentration of approximately $5 \times 10^{18}$, n-type regions have a doping concentration of approximately $10^{17}$, and the $p^+$-type region having a doping concentration approximately $10^{19}$ cm$^{-3}$.

22. The heterojunction bipolar transistor of claim 21 wherein each of the n, $n^+$ and $p^+$ regions are approximately 100 nm wide.

23. The heterojunction bipolar transistor of claim 9 or 10 wherein the compounds for the emitter, collector and base are lattice matched.

24. The heterojunction bipolar transistor of claim 9 or 10 wherein the compounds for the emitter, collector and base are random alloys.

25. The heterojunction bipolar transistor of claim 9 or 10 wherein the emitter and collector are formed of a superlattice structure of two binary compound semiconductors.

26. The heterojunction bipolar transistor of claim 25 wherein the superlattice structure is grown in an MBE system.

27. The heterojunction bipolar transistor of claim 23 wherein the emitter, base and collector are formed on a lattice matched substrate.

28. The heterojunction bipolar transistor of claim 9 or 10 wherein the substrate is GaAs and the emitter and collector is InGaP and the base is GaAlAs.

29. The heterojunction bipolar transistor of claim 28 wherein the emitter and collector is $In_{0.48}Ga_{0.52}P$ and the base is $Ga_{0.87}Al_{0.13}As$.

30. The heterojunction bipolar transistor of claim 29 wherein the emitter, base and collector is lattice matched to a GaAs substrate.

31. The heterojunction bipolar transistor of claim 5 wherein the collector layer and the emitter layer are both p-type and the base layer is n-type and wherein the abrupt energy level offset occurs in the conduction band and wherein the valence band energy levels are substantially aligned at the first and second heterojunctions.

32. The heterojunction bipolar transistor of claim 31 wherein the conduction band offset is approximately 0.4 eV or greater.

33. The heterojunction bipolar transistor of claim 32 wherein the base is InP and the emitter and collector are AlAsSb.

34. The heterojunction bipolar transistor of claim 33 wherein the conduction band offset is approximately 0.6 eV.

35. A semiconductor structure comprising:
an emitter layer, a collector layer and a base layer sandwiched between said emitter and collector layers, the emitter, base and collector layers being formed from semiconductor materials thereby forming at least one heterojunction, the semiconductor materials of each of the emitter, base and collector layers having conduction and valence band energy levels wherein the energy levels of one of said bands are substantially equal in the layers forming the at least one heterojunction and an energy level offset between the layers forming the at least one heterojunction occurs in the other of said bands.

36. The semiconductor structure of claim 35 wherein two heterojunctions are formed and wherein the energy levels in each of said layers are substantially equal in one of said bands and energy level offsets occur between the layers forming the heterojunctions in the other of said bands.

37. The semiconductor structure of claim 35 or 36 wherein the energy levels are substantially equal in the conduction band and the energy level offsets are in the valence band.

38. The semiconductor structure of claim 35 or 36 wherein the energy levels are substantially equal in the valence band and the energy level offsets are in the conduction band.

* * * * *